United States Patent
Zahurak et al.

[11] Patent Number: 5,960,294
[45] Date of Patent: Sep. 28, 1999

[54] METHOD OF FABRICATING A SEMICONDUCTOR DEVICE UTILIZING POLYSILICON GRAINS

[75] Inventors: John K. Zahurak; Scott J. DeBoer, both of Boise, Id.; Randhir P.S. Thakur, San Jose, Calif.; Mark Fischer, Boise, Id.

[73] Assignee: Micron Technology, Inc., Boise, Id.

[21] Appl. No.: 09/006,126

[22] Filed: Jan. 13, 1998

[51] Int. Cl.⁶ .................................................. H01L 21/20
[52] U.S. Cl. .......................................... 438/398; 438/255
[58] Field of Search .................................... 438/253, 255, 438/396, 398

[56] References Cited

U.S. PATENT DOCUMENTS

| | | |
|---|---|---|
| 5,352,623 | 10/1994 | Kamiyama . |
| 5,422,291 | 6/1995 | Clementi et al. . |
| 5,445,999 | 8/1995 | Thakur et al. . |
| 5,491,356 | 2/1996 | Dennison et al. ........................ 257/306 |
| 5,597,754 | 1/1997 | Lou et al. ................................ 438/255 |
| 5,817,555 | 10/1998 | Cho ........................................ 438/255 |

*Primary Examiner*—Tuan H. Nguyen
*Attorney, Agent, or Firm*—Workman, Nydegger & Seeley

[57] ABSTRACT

A method of fabricating capacitors for a dynamic random access memory device reduces double bit failures or shorts in the device. The method includes providing a semiconductor substrate underlying an insulative layer having a plurality of storage cells formed therein electrically connected to the substrate. A first conductive layer of rugged polysilicon, which functions as a first capacitor plate, is formed over the insulative layer in an oxygen-free atmosphere such that the first conductive layer is without natural oxides on the surface thereof. The surface of the first conductive layer in the oxygen-free atmosphere is then conditioned by a rapid thermal nitridization process which forms a silicon nitride film thereon. Thereafter, portions of the first conductive layer are removed from the insulative layer such that the plurality of storage cells are electrically isolated from one another. A dielectric layer is then formed over the first conductive layer and exposed insulative layer, followed by a second conductive layer, functioning as a second capacitor plate, being formed over the dielectric layer to complete the capacitor structure.

38 Claims, 3 Drawing Sheets

METHOD OF FABRICATING A SEMICONDUCTOR DEVICE UTILIZING POLYSILICON GRAINS

BACKGROUND OF THE INVENTION

1. The Field of the Invention

The present invention relates to methods for manufacturing semiconductor devices. More particularly, the present invention relates to a method for fabricating a semiconductor device, such as a capacitor, utilizing high temperature alloys to stabilize rugged polysilicon grains on the device.

2. The Relevant Technology

As integrated circuit technology has progressed, it has become possible to store ever-increasing amounts of digital data in a smaller space at less expense and still access the data randomly, quickly and reliably. Central to this increased ability to store and retrieve data has been the dynamic random access memory (DRAM), fabricated as an integrated circuit. The memory cells of DRAMs are comprised of two main components, a transistor and a capacitor. The capacitor of each memory cell functions to store an electrical charge representing a digital value (e.g., a charged capacitor representing a 1 and a discharged capacitor representing a 0) with the transistor acting as a switch to connect the capacitor to the "outside world" via decoding and other circuitry. In order to function properly, the capacitor must possess a minimum amount of capacitance. If a capacitor exhibits too little capacitance, it will cause errors in data storage.

Various approaches have been developed to increase the capacitance of a capacitor element in a memory cell of a DRAM device. For example, U.S. Pat. No. 5,352,623 to Kamiyama discloses a method in which a thin film of tantalum oxide is formed as a dielectric layer in a capacitor element. Prior to forming the tantalum oxide film, it is necessary to perform a separate step in order to remove a natural oxide film from the surface of a polysilicon layer forming a lower electrode of the capacitor element.

The capacitive value of a capacitor is dependent upon the dielectric constant of the material placed between the plates of the capacitor, the distance between the plates, and the effective area of the plates. In the case of integrated circuits, the material used as a dielectric between the plates is generally limited to only a few materials. Also, the minimum distance between the capacitor plates is generally limited to a particular value; once that value is exceeded, the occurrence of defects becomes unacceptably high. Thus, the one parameter that can be varied to obtain an increased storage capacity is the area of the plates. Accordingly, capacitance increases have also been achieved for a given dielectric thickness and for a given capacitor footprint area through an increase in the surface area of the capacitor.

A material that has been used to increase the surface area of capacitor plates and thereby cell capacitance is rugged polysilicon, which is a granular, rough material deposited in the capacitor module of DRAM cells as the lower plate below the dielectric layer. A drawback to the use of rugged polysilicon is that the conductive grains thereof can become detached from an underlying semiconductor substrate during subsequent processing and can redeposit between memory cells, causing electrical shorts or double bit failures of adjacent memory cells. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term semiconductor substrate is contemplated to include such structures as silicon-on-insulator and silicon-on-sapphire.

Much effort has been directed toward minimizing these electrical shorts, including dry etch recessing of the polysilicon grains, wet etch recessing of the polysilicon grains, and performing chemical/mechanical planarization (CMP) with a dry or wet recess of the polysilicon grains. Unfortunately, all of these techniques, while reducing double bit failures, also reduce capacitance in the capacitor element of a memory cell. Other methods of double bit failure reduction have focused on developing rugged polysilicon films with reduced roughness to provide for better adhesion to the underlying substrate. While these techniques reduce double bit failures, cell capacitance is reduced due to a loss in capacitor surface area.

Accordingly, there is a need for improved capacitor manufacturing methods that overcome or avoid the above problems.

SUMMARY OF THE INVENTION

The present invention is directed to methods for fabricating semiconductor devices such as capacitors used in memory cells of a DRAM device. The invention utilizes high temperature alloys to stabilize rugged polysilicon grains deposited during fabrication of the capacitors, thereby reducing double bit failures or shorts in the device.

In a method of the invention, a semiconductor substrate is provided which underlies an insulative layer having a plurality of storage cells formed therein electrically connected to the substrate. A first conductive layer of rugged polysilicon, which functions as a first capacitor plate, is formed over the insulative layer in an oxygen-free atmosphere such that the first conductive layer is without natural oxides on the surface thereof. The surface of the first conductive layer in the oxygen-free atmosphere is then conditioned by a rapid thermal nitridization (RTN) process which forms a silicon nitride film thereon. This nitriding "conditioning" step is thus performed in situ, such as by lamp-annealing or lamp-heating in the oxygen-free atmosphere of a deposition chamber for depositing the rugged polysilicon. The RTN step serves to harden the rugged polysilicon grains and improves their adhesion to the underlying substrate, thereby minimizing shorts in capacitors without reducing capacitance.

Thereafter, portions of the first conductive layer are removed from the insulative layer outside of the storage cells such that the plurality of storage cells are electrically isolated from one another. The portions of the first conductive layer can be removed by various processes such as by mechanical planarization, chemical/mechanical planarization, dry etch, or a combination thereof. A dielectric layer is formed over the remaining first conductive layer and exposed insulative layer, followed by a second conductive layer, functioning as a second capacitor plate, being formed over the dielectric layer to complete the capacitor structure. The first conductive layer, the dielectric layer, and the second conductive layer can be formed by a chemical vapor deposition process or other conventional processes.

In an alternative method of the invention, which is a non-in situ process, the above described steps are followed except that the RTN step and electrical isolation step are reversed. Thus, following deposition of the rugged polysilicon first conductive layer, the rugged polysilicon on the upper surface of the insulative layer outside of the storage cells is removed by CMP, dry etch, etc. Thereafter, the RTN procedure is used to nitridize any natural oxide present on the remaining rugged polysilicon layer in the storage cells. A dielectric layer is then formed over the nitridized rugged polysilicon layer and exposed insulative layer, and a second conductive layer is formed over the dielectric layer.

The present invention has the advantage of maintaining the full capacitance enhancement made possible through the use of rugged polysilicon while minimizing the double bit problem typically associated with using rugged polysilicon.

Other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention will be described and explained with additional specificity and detail through the use of the accompanying drawings in which.

DETAILED DESCRIPTION OF THE INVENTION

Figure 1A:
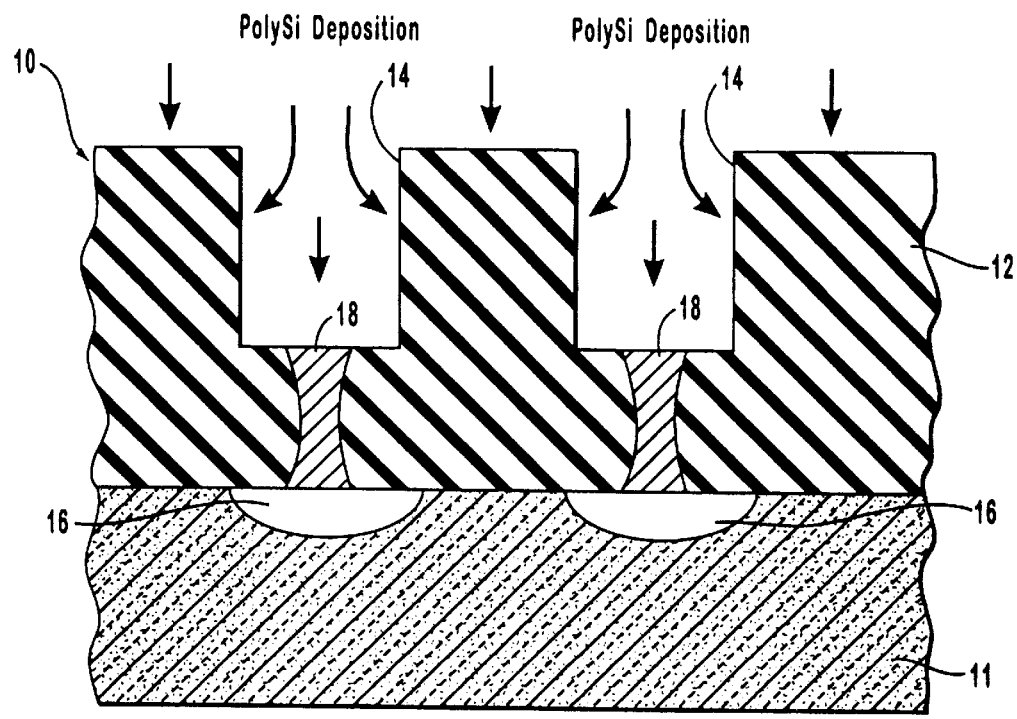
FIGS. 1A–1F are partial cross-sectional views showing successive steps in a method for manufacturing a semiconductor device according to the present invention.

The present invention is directed to methods for fabricating a semiconductor device such as capacitors used in memory cells of a DRAM device. As discussed in greater detail below, the capacitor formed according to the present invention generally includes a first conductive layer in the form of a lower capacitor plate made of rugged polysilicon, a dielectric layer over the first conductive layer, and a second conductive layer in the form of an upper capacitor plate over the dielectric layer.

The methods of the invention utilize high temperature alloys to stabilize rugged polysilicon grains deposited during fabrication. As used herein, the term "rugged" polysilicon refers to a polysilicon that is granular in nature or has a discontinuous crystalline structure. As discussed above, a drawback in using rugged polysilicon is that grains can become detached from the underlying substrate during processing and can redeposit between memory cells, causing double bit failures of adjacent memory cells. As used herein, the expression "double bit failure" means that two adjacent memory storage cells or bits fail because of a short circuit formed when a piece of rough grain polysilicon breaks off and extends between the two storage cells.

The methods of the present invention utilize a rapid thermal nitridization (RTN) "conditioning" step after the rugged polysilicon is deposited during formation of capacitor elements for a DRAM device. The RTN step serves to harden the rugged polysilicon grains and improve their adhesion to the underlying substrate. The methods of the invention thereby minimize shorts in a capacitor without reducing capacitance.

Referring to the drawings, wherein like structures are provided with like reference designations, the drawings are diagrammatic representations of integrated circuit structures. Thus, the actual appearance of the fabricated structures, for example in a photomicrograph, may appear different while still incorporating the essential structures of the present invention. Moreover, the drawings only show the structures necessary to understand the present invention. Additional structures known in the art have not been included to maintain the clarity of the drawings. FIGS. 1A–1F are partial cross-sectional views showing successive steps in a method for manufacturing a pair of capacitor elements for a DRAM device according to the present invention.

FIG. 1A shows a semiconductor device 10, which has been partially fabricated according to techniques known in the art. The semiconductor device 10 includes a silicon substrate 11 with an insulative layer 12 thereon such as a layer of borophosphosilicate glass (BPSG), borosilicate glass (BSG), or phosphosilicate glass (PSG). Also, the use of spin-on-glass (SOG) is contemplated. Other insulators include a deposited oxide, silicon nitride, or a polyimide film. A plurality of containers or storage cells 14 having a generally cylindrical shape are formed in the surface of the insulative layer 12. The storage cells 14 provide individual locations for forming the capacitor elements as discussed in greater detail below. The storage cells 14 are in conductive communication with active areas 16 of transistor elements (not shown) by way of conductive plugs 18 formed in contact holes in insulative layer 12. The conductive plugs 18 can be formed of polysilicon or other electrically conductive materials. The above elements of semiconductor device 10 are all formed by conventional techniques known in the art.

Figure 1B:
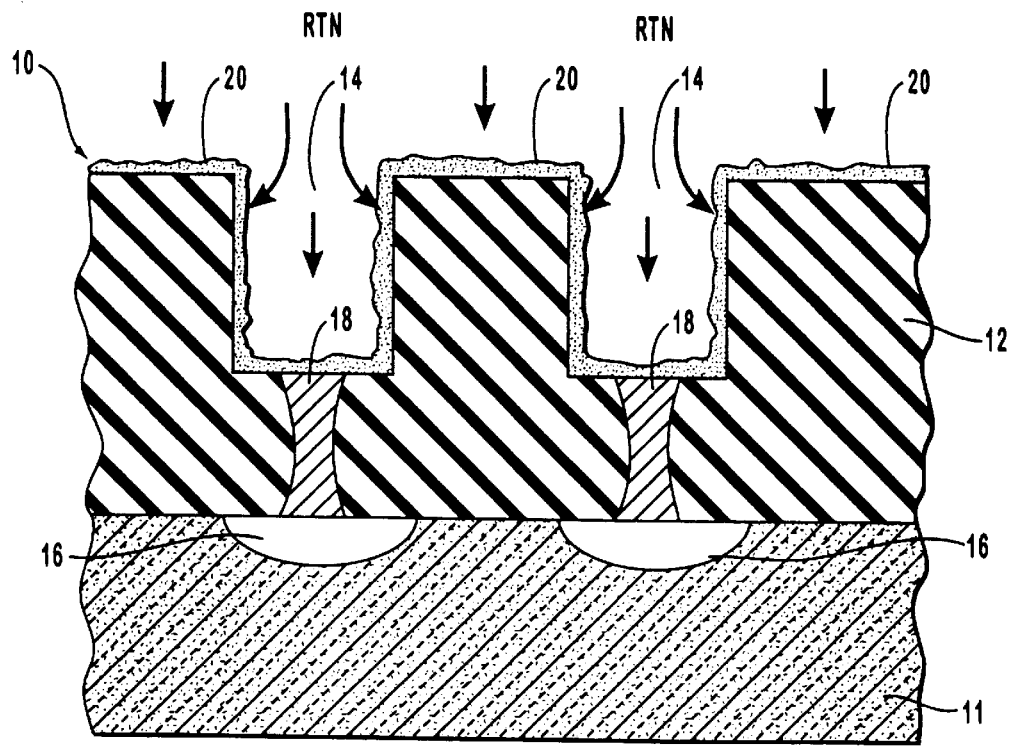

The insulative layer 12 on substrate 11 is exposed to a polysilicon deposition process as shown in FIG. 1A in order to form a first conductive layer 20 made of rugged polysilicon, as shown in FIG. 1B. The first conductive layer 20 in storage cells 14 functions as a lower capacitor plate for a memory cell of a DRAM device, and is connected to the respective active areas 16 via the respective conductive plugs 18 formed in insulative layer 12. The conductive layer 20 can be formed by chemical vapor deposition in a deposition chamber, or by other conventional techniques, and preferably has a thickness of from about 500 angstroms to about 3,000 angstroms. It should be noted that the contact holes where conductive plugs 18 are located may be filled with polysilicon to form conductive plugs 18 during the deposition process to form first conductive layer 20 or during a previous processing step.

The rugged polysilicon of first conductive layer 20 can be formed or grown under any conditions which maximize surface area thereof. For example, the rugged polysilicon can be hemispherical silicon grain (HSG), brain coral (extremely large grain polysilicon), etc. A temperature regime known to those skilled in the art can be used to vary the roughness of the rugged polysilicon during the deposition process.

Figure 1C:
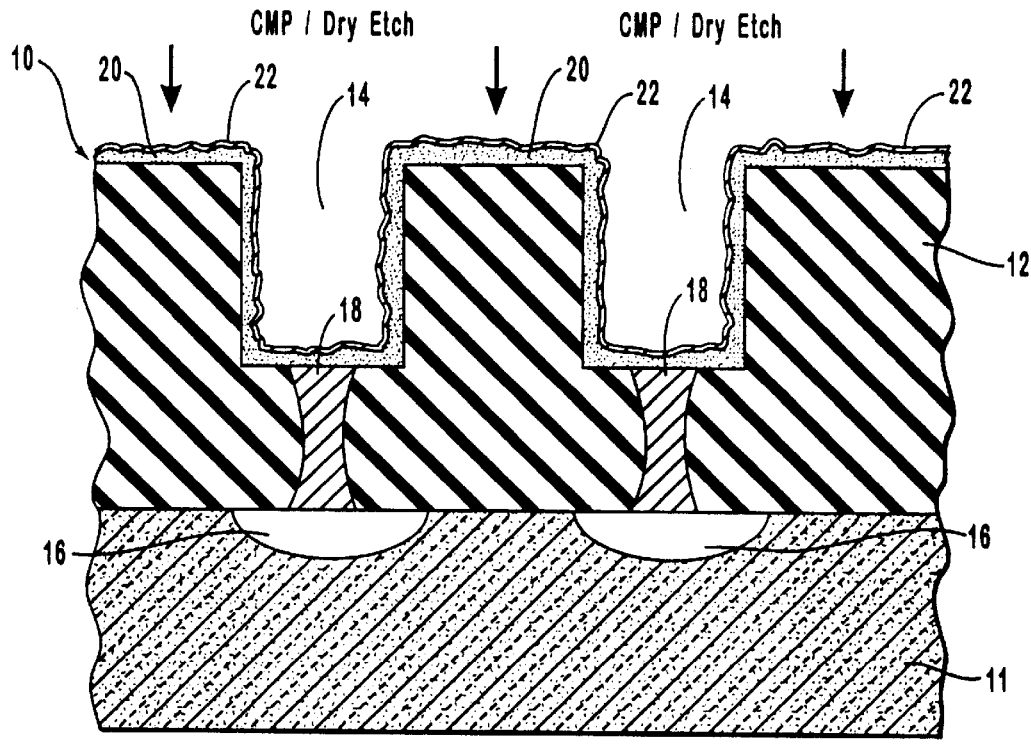

Subsequent to the rugged polysilicon deposition to form first conductive layer 20, a nitriding "conditioning" step is performed in situ in which the surface of the rugged polysilicon of first conductive layer 20 is subjected to rapid thermal nitridization (RTN), as shown in FIG. 1B. The RTN step can be performed by lamp-annealing or lamp heating in an oxygen-free atmosphere while semiconductor device 10 is still in a deposition chamber for depositing the rugged polysilicon. During the RTN step, the surface of the rugged polysilicon of first conductive layer 20 is reacted with nitrogen to form a thin film 22 thereon of silicon nitride (SiN$_x$), as shown in FIG. 1C. The RTN step is preferably performed at a temperature from about 800° C. to about 1100° C. with a gas such as nitrogen, ammonia, N$_2$H$_4$, or monomethyl hydrazine.

The RTN step causes an increase in the strength of the rugged polysilicon of first conductive layer 20, preventing grains of polysilicon from breaking apart during further processing and causing a short or double bit failure. Since the RTN procedure is performed in situ, the formation of native oxides on the surface of the rugged polysilicon is avoided as the polysilicon is not exposed to ambient air before nitridization by the RTN procedure. This eliminates the need for an extra processing step to remove any native oxides on the surface of the rugged polysilicon as required in prior conventional procedures.

Following the RTN step, the storage cells 14 containing the first conductive layer 20 and thin film 22 are electrically isolated from each other by removing the portions of first conductive layer 20 and thin film 22 on insulative layer 12 between storage cells 14. Such a removal step can be performed by mechanical planarization, chemical/mechanical planarization, dry etch, or a combination thereof, which is applied to the upper surface of device 10 outside of storage cells 14, as shown in FIG. 1C. This removes first conductive layer 20 from the upper surface of device 10, leaving storage cells 14 electrically isolated from each other, as shown in FIG. 1D.

An optional step that can be performed after the above electrical isolation step is to remove any natural oxides formed on the exposed rugged polysilicon at upper edge 23 of first conductive layer 20 in storage cells 14. The device 10 can be dipped in diluted hydrofluoric acid or anhydrous hydrogen fluoride to remove any natural oxide film formed on the exposed polysilicon at upper edge 23. This is an optional step since the exposed polysilicon at upper edge 23 has a relatively small surface area compared to the remaining rugged polysilicon of first conductive layer 20 with thin film 22 thereover, and any remaining oxides on upper edge 23 would not have a noticeable effect on the capacitance of the memory cells.

Figure 1D:
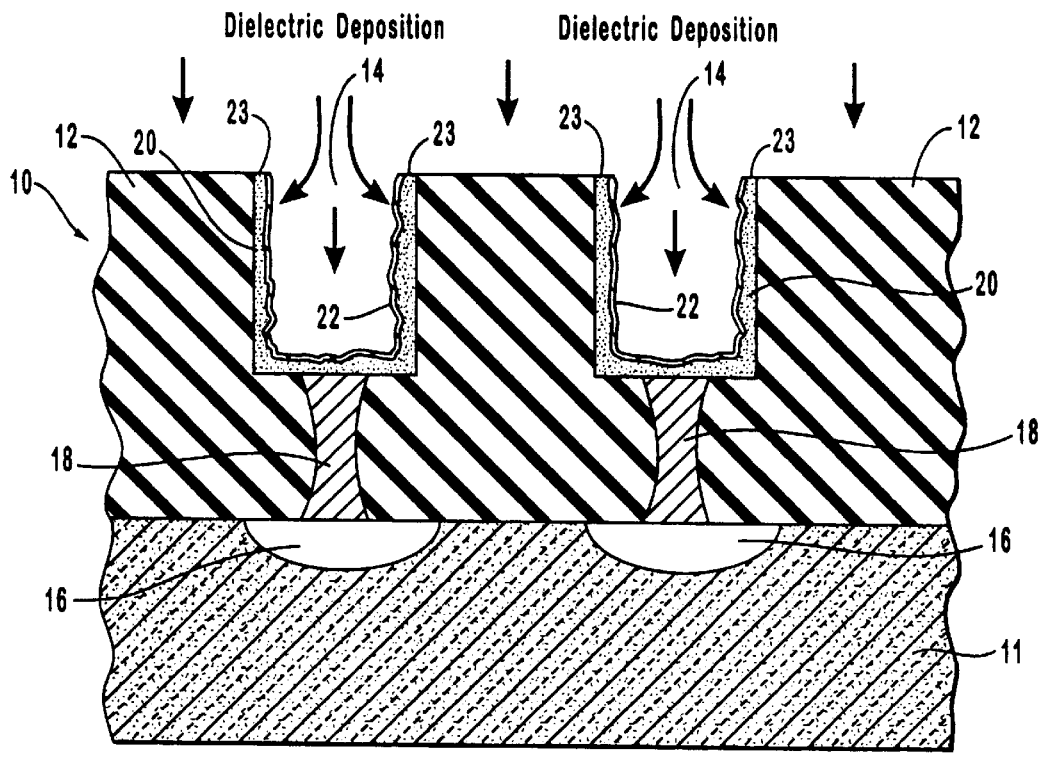
Figure 1E:
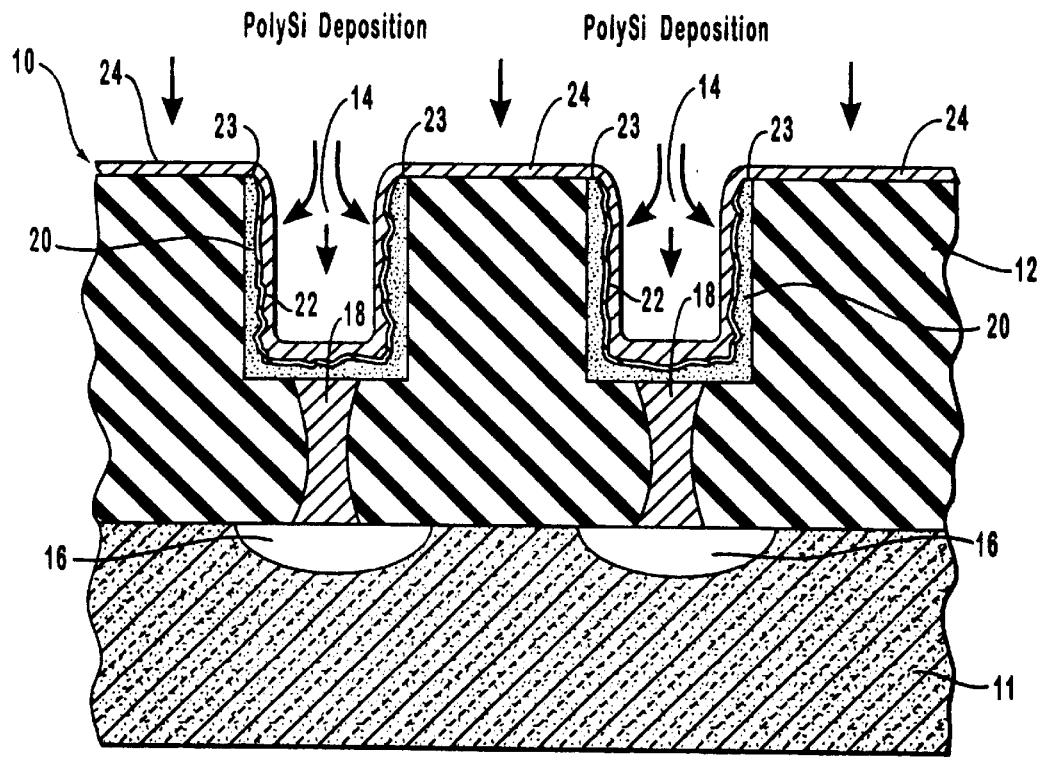

Thereafter, the entire upper surface of device 10 and storage cells 14 are subjected to a dielectric deposition process, as shown in FIG. 1D. This forms a dielectric layer 24 over the entire upper surface of device 10 and in storage cells 14, as shown in FIG. 1E. The dielectric layer 24 can be formed by chemical vapor deposition in a tube furnace or by other conventional processes. The dielectric layer 24 preferably has a thickness of from about 40 angstroms to about 100 angstroms, and can be made of various materials such as silicon nitride, silicon dioxide, tantalum, barium strontium titanate, combinations thereof, and the like.

Figure 1F:
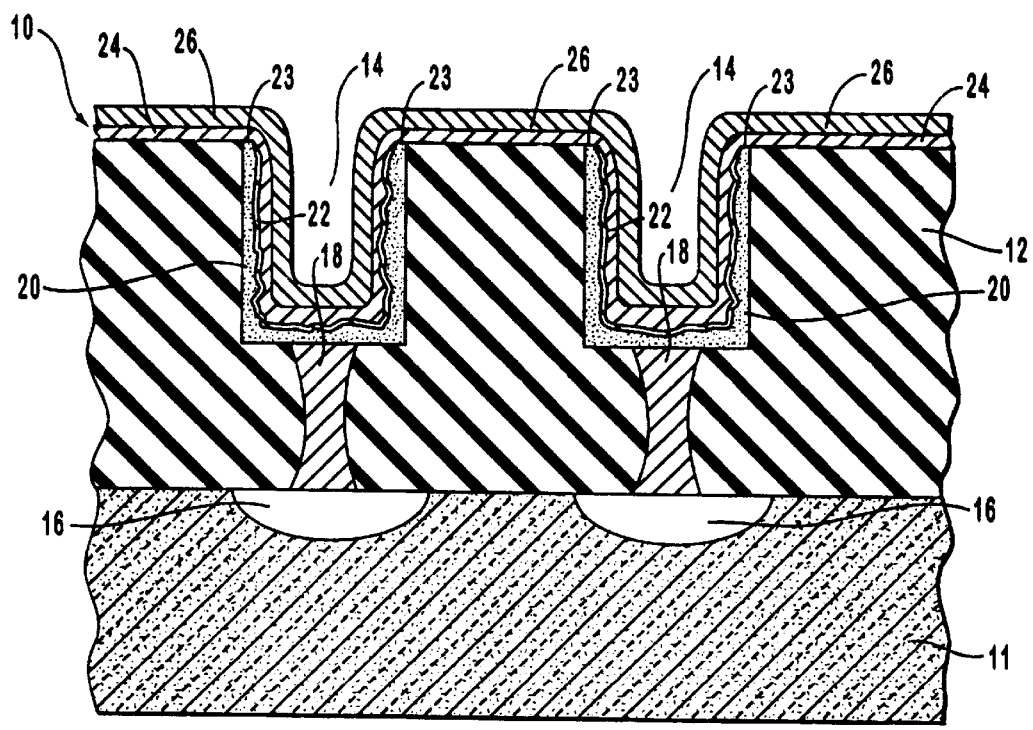

The upper surface of dielectric layer 24 is then subjected to a deposition process as shown in FIG. 1E. This forms a second conductive layer 26, as shown in FIG. 1F, which functions as an upper capacitor plate that is common to all of the memory cells. The second conductive layer 26 preferably has a thickness from about 300 angstroms to about 4,000 angstroms and is made of polysilicon, although other materials can used such as titanium nitride, tungsten, molybdenum, tungsten silicide, tantalum, tungsten nitride, Ru, RuO$_x$, Ir, IrO$_x$, combinations thereof, and the like. The formation of second conductive layer 26 completes construction of the capacitor elements for semiconductor device 10.

In an alternative method of the invention, which is a non-in situ process, the above described steps are followed except that the RTN step and the electrical isolation step are reversed. Thus, following deposition of the rugged polysilicon of the first conductive layer, the rugged polysilicon on the upper surface of the insulative layer outside of the storage cells is removed by CMP, dry etch, etc. Thereafter, the RTN procedure is used to nitridize any natural oxide present on the remaining rugged polysilicon layers in the storage cells. A dielectric layer is then formed over the nitridized rugged polysilicon layer and exposed insulative layer, and a second conductive layer is formed over the dielectric layer, as described above.

In experiments performed using the methods of the invention, it was shown that the RTN conditioning step utilized at a temperature of about 850° C. for about 10–20 seconds resulted in a double bit reduction in excess of about 30% over a procedure where no RTN step is performed.

The present invention has the advantage of exploiting the full potential of rugged polysilicon used in capacitor elements while reducing double bit failures. Thus, the present invention maintains the full capacitance enhancement made possible through the use of rugged polysilicon while minimizing the double bit failure problem typically associated with using rugged polysilicon. Further, the full capacitance increase achieved by utilizing rugged polysilicon is not reduced by the RTN conditioning step. The method of the invention also eliminates the need for an extra processing step in that a native oxide removal step is not required as in prior conventional processes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of fabricating a semiconductor device, comprising:

providing a semiconductor substrate underlying an insulative layer having a plurality of storage cells formed therein;

forming a first conductive layer over the insulative layer in an oxygen-free atmosphere such that the first conductive layer is formed without natural oxides thereon, said first conductive layer being composed of HSG polysilicon;

conditioning the surface of the first conductive layer in the oxygen-free atmosphere by a rapid thermal nitridization process to form a layer of silicon nitride on the first conductive layer;

removing portions of the first conductive layer such that the plurality of storage cells are electrically isolated from one another;

forming a dielectric layer over the first conductive layer and, the layer of silicon nitride; and forming a second conductive layer over the dielectric layer.

2. The method of claim 1, wherein the semiconductor device is a dynamic random access memory device.

3. The method of claim 1, wherein the first conductive layer, the dielectric layer, and the second conductive layer form capacitor elements.

4. The method of claim 1, wherein the first conductive layer, the dielectric layer, and the second conductive layer are formed by a chemical vapor deposition process.

5. The method of claim 1, wherein the insulative layer is composed of a material selected from the group consisting of BPSG, BSG, PSG, SOG, silicon nitride, oxides of silicon, and polyimide.

6. The method of claim 1, wherein the storage cells have a substantially cylindrical shape.

7. The method of claim 1, wherein conditioning the surface of the first conductive layer in the oxygen-free atmosphere by a rapid thermal nitridization process is conducted at a temperature from about 800° C. to about 1100° C. using a gas selected from a group consisting of nitrogen, ammonia, $N_2H_4$, and monomethyl hydrazine.

8. The method of claim 1, wherein the step of removing portions of the first conductive layer is performed by a process selected from the group consisting of mechanical planarization, chemical/mechanical planarization, dry etch, or a combination thereof.

9. The method of claim 1, wherein the dielectric layer is formed from a material selected from the group consisting of silicon nitride, silicon dioxide, tantalum oxide, barium strontium titanate, and combinations thereof.

10. The method of claim 1, wherein the second conductive layer is formed from a material selected from the group consisting of polysilicon, titanium nitride, tungsten, molybdenum, tungsten silicide, tantalum, tungsten nitride, Ru, $RuO_x$, Ir, $IrO_x$, and combinations thereof.

11. A method of fabricating capacitors for a dynamic random access memory device, the method comprising:

providing a semiconductor substrate underlying an insulative layer having a plurality of storage cells formed therein electrically connected to the substrate;

forming a first conductive layer of HSG polysilicon over the insulative layer in an oxygen-free atmosphere such that the first conductive layer is formed without natural oxides thereon, the first conductive layer functioning as a first capacitor plate;

nitriding the surface of the first conductive layer in the oxygen-free atmosphere by rapid thermal nitridization to form a silicon nitride film thereon;

removing portions of the first conductive layer from the insulative layer such that the plurality of cells are electrically isolated from one another;

forming a dielectric layer over the remaining first conductive layer, the silicon nitride film, and exposed insulative layer; and forming a second conductive layer of polysilicon over the dielectric layer, the second conductive layer functioning as a second capacitor plate.

12. The method of claim 11, wherein the first conductive layer, the dielectric layer, and the second conductive layer are formed by a chemical vapor deposition process.

13. The method of claim 11, wherein the nitriding step is conducted at a temperature from about 800° C. to about 1100° C. using a gas selected from a group consisting of nitrogen, ammonia, $N_2H_4$, and monomethyl hydrazine.

14. The method of claim 11, wherein the step of removing portions of the first conductive layer is performed by a process selected from the group consisting of mechanical planarization, chemical/mechanical planarization, dry etch, or a combination thereof.

15. The method of claim 11, wherein the dielectric layer is formed from a material selected from the group consisting of silicon nitride, silicon dioxide, tantalum oxide, barium strontium titanate, and combinations thereof.

16. A method of fabricating capacitors for a dynamic random access memory device, the method comprising:

providing a semiconductor substrate underlying an insulative layer having a plurality of storage cells formed therein electrically connected to the substrate;

depositing a first conductive layer of HSG polysilicon by chemical vapor deposition over the insulative layer in an oxygen-free atmosphere such that the first conductive layer is formed without natural oxides thereon, the first conductive layer functioning as a first capacitor plate;

nitriding the surface of the first conductive layer in the oxygen-free atmosphere at a temperature from about 800° C. to about 1100° C. using a gas selected from a group consisting of nitrogen, ammonia, $N_2H_4$, and monomethyl hydrazine by rapid thermal nitridization to form a silicon nitride film thereon;

removing portions of the first conductive layer from the insulative layer such that the plurality of cells are electrically isolated from one another by a process selected from the group consisting of mechanical planarization, chemical/mechanical planarization, dry etch, or a combination thereof;

forming a dielectric layer over the remaining first conductive layer, the silicon nitride film, and exposed insulative layer; and depositing a second conductive layer of polysilicon by chemical vapor deposition over the dielectric layer, the second conductive layer functioning as a second capacitor plate.

17. The method of claim 16, wherein the dielectric layer is formed by a chemical vapor deposition process.

18. A method of fabricating a semiconductor device, comprising:

providing a semiconductor substrate underlying an insulative layer having a plurality of storage cells formed therein;

forming a first conductive layer over the insulative layer;

removing portions of the first conductive layer such that the plurality of storage cells are electrically isolated from one another;

conditioning the surface of the remaining portions of the first conductive layer by a rapid thermal nitridization process to nitridize any natural oxides present on the surface of the first conductive layer and to form a layer of silicon nitride;

forming a dielectric layer over the first conductive layer, the layer of silicon nitride, and exposed insulative layer; and forming a second conductive layer over the dielectric layer.

19. The method of claim 18, wherein the semiconductor device is a dynamic random access memory device.

20. The method of claim 18, wherein the first conductive layer, the dielectric layer, and the second conductive layer form capacitor elements.

21. The method of claim 18, wherein the first conductive layer, the dielectric layer, and the second conductive layer are formed by a chemical vapor deposition process.

22. The method of claim 18, wherein the dielectric layer is formed from a material selected from the group consisting of silicon nitride, silicon dioxide, tantalum oxide, barium strontium titanate, and combinations thereof.

23. The method of claim 18, wherein the second conductive layer is formed from a material selected from the group consisting of polysilicon, titanium nitride, tungsten, molybdenum, tungsten silicide, tantalum, tungsten nitride, Ru, $RuO_x$, Ir, $IrO_x$, and combinations thereof.

24. A method of fabricating a semiconductor device, comprising:
  providing a semiconductor substrate underlying an insulative layer having a plurality of storage cells formed therein;
  depositing a first conductive layer over the insulative layer by chemical vapor deposition, the first conductive layer being composed of HSG polysilicon;
  removing portions of the first conductive layer such that the plurality of storage cells are electrically isolated from one another by a process selected from the group consisting of mechanical planarization, chemical/mechanical planarization, dry etch, or a combination thereof;
  conditioning the surface of the remaining portions of the first conductive layer by a rapid thermal nitridization process at a temperature from about 800° C. to about 1100° C. using a gas selected from a group consisting of nitrogen, ammonia, $N_2H_4$, and monomethyl hydrazine to nitridize any natural oxides present on the surface of the first conductive layer and to form a layer of silicon nitride on the first conductive layer;
  forming a dielectric layer over the first conductive layer, the layer of silicon nitride, and exposed insulative layer; and
  depositing a second conductive layer over the dielectric layer by chemical vapor deposition.

25. The method of claim 24, wherein the dielectric layer is formed by a chemical vapor deposition process.

26. A method of fabricating capacitors for a dynamic random access memory device, the method comprising:
  providing a semiconductor substrate underlying an insulative layer having a plurality of storage cells formed therein electrically connected to the substrate;
  forming a first conductive layer of HSG polysilicon over the insulative layer, the first conductive layer functioning as a first capacitor plate;
  removing portions of the first conductive layer such that the plurality of storage cells are electrically isolated from one another;
  nitriding the surface of the remaining portions of the first conductive layer by rapid thermal nitridization to nitridize any natural oxides present on the surface of the first conductive layer and form a silicon nitride film thereon;
  forming a dielectric layer over the remaining first conductive layer, the silicon nitride film, and exposed insulative layer; and
  forming a second conductive layer of polysilicon over the dielectric layer, the second conductive layer functioning as a second capacitor plate.

27. The method of claim 26, wherein the first conductive layer, the dielectric layer, and the second conductive layer are formed by a chemical vapor deposition process.

28. The method of claim 26, wherein nitriding the surface of the remaining portions of the first conductive layer is conducted at a temperature from about 800° C. to about 1100° C. using a gas selected from a group consisting of nitrogen, ammonia, $N_2H_4$, and monomethyl hydrazine.

29. The method of claim 26, wherein the step of removing portions of the first conductive layer is performed by a process selected from the group consisting of mechanical planarization, chemical/mechanical planarization, dry etch, or a combination thereof.

30. The method of claim 26, wherein the dielectric layer is formed from a material selected from the group consisting of silicon nitride, silicon dioxide, tantalum oxide, barium strontium titanate, and combinations thereof.

31. A method of fabricating capacitors for a dynamic random access memory device, the method comprising:
  providing a semiconductor substrate underlying an insulative layer;
  forming an electrically conductive plug extending through the insulative layer from the semiconductor substrate;
  forming a storage cell that is electrically connected to the substrate by the electrically conductive plug;
  depositing a first conductive layer of HSG polysilicon by chemical vapor deposition over the insulative layer, the first conductive layer functioning as a first capacitor plate;
  removing portions of the first conductive layer such that the plurality of storage cells are electrically isolated from one another by a process selected from the group consisting of mechanical planarization, chemical/mechanical planarization, dry etch, or a combination thereof;
  nitriding the surface of the remaining portions of the first conductive layer by rapid thermal nitridization at a temperature from about 800° C. to about 1100° C. using a gas selected from a group consisting of nitrogen, ammonia, $N_2H_4$, and monomethyl hydrazine to nitridize any natural oxides present on the surface of the first conductive layer and form a silicon nitride film on the first conductive layer and exposed insulative layer;
  forming a dielectric layer over the remaining first conductive layer, the silicon nitride film, and exposed insulative layer; and
  depositing a second conductive layer of polysilicon by chemical vapor deposition over the dielectric layer, the second conductive layer functioning as a second capacitor plate.

32. A method of forming a capacitor comprising:
  providing a substrate having an insulative layer thereon;
  forming a recess in the insulative layer;
  forming a first capacitor plate composed of HSG polysilicon within the recess;
  forming a silicon nitride layer on the first capacitor plate within the recess;
  forming a dielectric layer on silicon nitride layer within the recess; and
  forming a second capacitor plate on the dielectric layer within the recess.

33. The method as defined in claim 32, wherein the first capacitor plate is upon the insulative layer within the recess.

34. The method as defined in claim 32, wherein:
  the silicon nitride layer is formed by a rapid thermal nitridization process performed upon a surface of the first capacitor plate; and
  the dielectric layer is formed by a deposition process.

35. A method of forming capacitors comprising:
  forming a plurality of recesses in an insulative layer;
  forming a first capacitor plate composed of HSG polysilicon within each said recess;
  forming a silicon nitride layer on the HSG polysilicon capacitor plate within each said recess;

forming a dielectric layer on silicon nitride layer within each said recess; and forming a second capacitor plate on the dielectric layer within each said recess.

36. The method as defined in claim 35, wherein:

the insulative layer has a planar surface extending between adjacent recesses therein.

37. A method of forming a capacitor comprising:

forming a first capacitor plate composed of HSG polysilicon over an insulative layer;

forming a silicon nitride layer on the first capacitor plate;

forming a dielectric layer on silicon nitride layer; and forming a second capacitor plate on the dielectric layer.

38. The method as defined in claim 37, wherein:

the silicon nitride layer is formed by a rapid thermal nitridization process performed upon a surface of the first capacitor plate; and the dielectric layer is formed by a deposition process.

* * * * *